(12) United States Patent
Bae

(10) Patent No.: US 11,038,073 B2
(45) Date of Patent: Jun. 15, 2021

(54) SOLAR POWER GENERATION UNIT AND SYSTEM

(71) Applicant: Suk Man Bae, Yongin-si (KR)

(72) Inventor: Suk Man Bae, Yongin-si (KR)

(73) Assignee: Suk Man Bae, Gyeonggi-do (KR)

( * ) Notice: Subject to any disclaimer, the term of this patent is extended or adjusted under 35 U.S.C. 154(b) by 165 days.

(21) Appl. No.: 16/381,066

(22) Filed: Apr. 11, 2019

(65) Prior Publication Data

US 2020/0006586 A1 Jan. 2, 2020

Related U.S. Application Data

(60) Provisional application No. 62/692,971, filed on Jul. 2, 2018.

(30) Foreign Application Priority Data

Jan. 25, 2019 (KR) .................. 10-2019-0010070

(51) Int. Cl.
*H01L 31/054* (2014.01)
*F21V 8/00* (2006.01)
*G02B 6/38* (2006.01)
*H01L 31/0232* (2014.01)

(52) U.S. Cl.
CPC .......... *H01L 31/054* (2014.12); *G02B 6/0006* (2013.01); *G02B 6/0008* (2013.01); *G02B 6/3897* (2013.01); *H01L 31/02327* (2013.01)

(58) Field of Classification Search
CPC ...................................................... F24S 23/12
See application file for complete search history.

(56) References Cited

U.S. PATENT DOCUMENTS

| 4,411,490 | A | * | 10/1983 | Daniel | ..................... F21S 11/00 |
| | | | | | 126/648 |
| 4,687,880 | A | | 8/1987 | Morris | |
| 5,089,055 | A | * | 2/1992 | Nakamura | ............... G02B 6/32 |
| | | | | | 136/248 |

(Continued)

FOREIGN PATENT DOCUMENTS

| CA | 3 021 604 A1 | 11/2017 |
| CN | 101162879 A | 4/2008 |

(Continued)

OTHER PUBLICATIONS

English machine translation of Messaoudi (FR 3033963 A1) provided by the EPO website. All Pages. 2021. (Year: 2021).*

(Continued)

*Primary Examiner* — Daniel P Malley, Jr.
(74) *Attorney, Agent, or Firm* — Buchanan Ingersoll & Rooney PC

(57) ABSTRACT

A solar power generation unit includes at least one optical fiber including a light output region including a light output window and a light guide region guiding a light wave to the light output region; a housing of a tube type, the housing having an inner space in which the at least one optical fiber is located; and a power generation part including a solar panel provided at least at a side of the inner space of the housing and configured to generate power in response to the light wave incident thereon from the light output region of the at least one optical fiber.

11 Claims, 12 Drawing Sheets

(56) References Cited

U.S. PATENT DOCUMENTS

| | | | | |
|---|---|---|---|---|
| 5,575,860 | A | * | 11/1996 | Cherney .................. F24S 23/30 136/245 |
| 8,664,523 | B2 | * | 3/2014 | Wang .................. H01L 31/0547 136/259 |
| 10,473,852 | B2 | * | 11/2019 | Dhar .................... H01L 31/0543 |
| 2009/0277495 | A1 | * | 11/2009 | Talaba .................... H02S 40/38 136/246 |
| 2010/0229939 | A1 | | 9/2010 | Shen |
| 2010/0258160 | A1 | | 10/2010 | Wang et al. |
| 2012/0024357 | A1 | * | 2/2012 | Chen .................... H01L 31/0547 136/252 |
| 2012/0138780 | A1 | * | 6/2012 | Heidler ................. G02B 6/4289 250/227.21 |
| 2013/0133736 | A1 | * | 5/2013 | Van Bommel .......... G09F 13/20 136/256 |
| 2013/0319500 | A1 | | 12/2013 | Bizzell et al. |
| 2014/0153604 | A1 | * | 6/2014 | Nunez Bootello ... H01L 31/054 372/50.1 |
| 2014/0158182 | A1 | * | 6/2014 | Watkins .................. H02J 11/00 136/246 |
| 2015/0034144 | A1 | | 2/2015 | Stone et al. |
| 2017/0187322 | A1 | * | 6/2017 | Pisharodi ................ H01L 31/05 |
| 2019/0131921 | A1 | * | 5/2019 | Bae ......................... H02S 40/22 |

FOREIGN PATENT DOCUMENTS

| | | | | |
|---|---|---|---|---|
| DE | 19735281 | A1 | * 2/1999 | ............ F24S 23/00 |
| EP | 2 993 705 | A1 | 3/2016 | |
| FR | 3033963 | A1 | * 9/2016 | ............ G02B 6/001 |
| JP | H04-111475 | A | 4/1992 | |
| JP | H10-150215 | A | 6/1998 | |
| JP | 2013-149879 | A | 8/2013 | |
| JP | 2013-214643 | A | 10/2013 | |
| JP | 2015-106684 | A | 6/2015 | |
| JP | 2017-127040 | A | 7/2017 | |
| JP | 2018-007437 | A | 1/2018 | |
| KR | 10-0729917 | B1 | 6/2007 | |

OTHER PUBLICATIONS

English machine translation of Hoericht (DE 197 35 281 A1) provided by the EPO website. All Pages. 2021. (Year: 2021).*

Office Action (Communication pursuant to Article 94(3) EPC) dated Sep. 25, 2020, by the European Patent Office in corresponding European Patent Application No. 19 183 664.2-1230. (5 pages).

Office Action (Notice of Reasons for Refusal) issued on Sep. 8, 2020, by the Japanese Patent Office in corresponding Japanese Patent Application No. 2019-123198 and an English Translation of the Office Action. (15 pages).

Office Action (Notification of Reason for Refusal) issued on Aug. 19, 2020, by the Korean Intellectual Property Office in corresponding Korean Patent Application No. 10-2020-0078816, and an English Translation of the Office Action. (13 pages).

The extended European Search Report dated Nov. 15, 2019, by the European Patent Office in corresponding European Patent Application No. 19183664.2-1230. (8 pages).

Office Action (Notification of Reason for Refusal) dated Nov. 25, 2019, by the Korean Intellectual Property Office in corresponding Korean Patent Application No. 10-2019-0010070 and an English Translation of the Office Action. (15 pages).

* cited by examiner

SOLAR POWER GENERATION UNIT AND SYSTEM

CROSS-REFERENCE TO RELATED APPLICATIONS

This application claims the benefit of U.S. Provisional Application No. 62/692,971, filed on Jul. 2, 2018, in the United States Patent and Trademark Office, and Korean Patent Application No. 10-2019-0010070, filed on Jan. 25, 2019, in the Korean Intellectual Property Office, the disclosures of which are incorporated herein in their entirety by reference.

BACKGROUND

1. Field

One or more embodiments relate to a solar power generation unit and a solar power generation system, and more particularly, to a solar power generation unit and a solar power generation system massively integrated and having large capacity.

2. Description of the Related Art

Solar power generation using the sunlight, which is an infinite energy source, uses a structure including a panel or a sheet in which a plurality of solar cells are provided, wherein the sunlight having high energy is incident into the structure. The solar power generation system does not have high photoelectric conversion efficiency, and thus, a very wide mounting area is required for high capacity generation.

The sunlight has a very extensive wavelength range, which includes an area of visible rays that is about 400 nm to about 700 nm. The sunlight does not have a constant intensity for every wavelength range. Presently, a solar panel based on crystalline silicon having high purity, which is generally used for solar power generation, absorbs about 90% of only a wavelength range of about 500 nm to about 850 nm, and with respect to the rest wavelength range, the efficiency may be low or may absorb little.

A solar panel unit of a solar power generation system is divided into a direct type, whereby the sunlight is allowed to directly reach a flat surface of a solar panel to directly irradiate the solar panel, and a condensing type, whereby a reflection mirror, a focusing lens, or the like is used for the solar panel. A solar power generation facility mounted on a rooftop of a building or on the ground mainly applies the direct type, but this has a lower efficiency than the condensing type using the lens or the mirror. The condensing type, which compensates for defects of the direct type, has to have a complex optical structure and a supporting structure thereof. Thus, the manufacturing cost of these related arts is high and reduction of a life span of the solar panel due to high condensing is inevitable.

SUMMARY

One or more embodiments include a solar power generation unit capable of high capacity power generation in a space with a limited area and a solar power generation system implementing the solar power generation unit.

One or more embodiments include a solar power generation unit of a bar type that may be massively integrated and a solar power generation system implementing the solar power generation unit.

Additional aspects will be set forth in part in the description which follows and, in part, will be apparent from the description, or may be learned by practice of the presented embodiments.

According to one or more embodiments, a solar power generation unit includes: at least one optical fiber including a light output region including a light output window and a light guide region guiding a light wave to the light output region; a housing of a tube type, the housing having an inner space in which the at least one optical fiber is located; and a power generation part including at least one solar panel provided at least at a side of the inner space of the housing and configured to generate power in response to the light wave incident thereon from the light output region of the at least one optical fiber.

The housing may have a cross-section with a square shape, a polygon shape, a circle shape, or an oval shape.

The housing may have a plurality of walls forming the inner space, the at least one optical fiber may be located in a middle region of the inner space of the housing, and the solar panel may be formed or mounted in at least one of the plurality of walls.

One or more ribs supporting the at least one optical fiber located in the inner space may be formed to protrude from the plurality of walls of the housing.

The light output window may include continuous or discontinuous grooves formed in a spiral shape in an outer circumferential surface of the at least one optical fiber.

The housing may have a plurality of walls surrounding the at least one optical fiber, the at least one optical fiber may be located in at least one of a plurality of corners between the plurality of walls in the inner space, and the solar panel on which the light wave is incident from the light output region of the at least one optical fiber may be formed or mounted in at least one of the plurality of walls.

The inner space of the housing of the tube type may have an inner wall with a corrugated shape, and the solar panel may be formed in the inner wall.

A rib supporting the at least one optical fiber may be formed in an inner wall of the housing, and the solar panel may be formed in the inner wall and the rib of the housing.

The housing may have an inner wall with a corrugated shape, and the solar panel may be formed in the inner wall and the at least one optical fiber is apart from the inner wall.

The inner space of the housing may be isolated from outside by an end cap and may be maintained in an air tight or vacuum state.

According to one or more embodiments, a solar power generation system includes: a plurality of solar power generation units; and an optical structure for supplying sunlight to at least one of the plurality of solar power generation units, wherein at least one of the solar power generation units includes: at least one optical fiber including a light output region including at least one light output window and a light guide region guiding a light wave to the light output region; a housing of a tube type, the housing having an inner space in which the at least one optical fiber is located; and a power generation part including at least one solar panel provided at least at a side of the inner space of the housing and configured to generate power in response to the light wave incident thereon from the light output region of the at least one optical fiber, and the optical structure is configured to converge sunlight to the light guide region of the at least one optical fiber and supply the light wave to the solar power generation unit.

The housing may have a plurality of walls forming the inner space, the at least one optical fiber may be located in a middle region of the inner space of the housing, and the solar panel may be formed or mounted in at least one of the plurality of walls.

One or more ribs supporting the at least one optical fiber located in the inner space may be formed to protrude from the plurality of walls of the housing.

The light output window may include continuous or discontinuous grooves formed in a spiral shape in an outer circumferential surface of the at least one optical fiber.

The housing may have a plurality of walls surrounding the at least one optical fiber, the at least one optical fiber may be located in at least one of a plurality of corners between the plurality of walls in the inner space, and the solar panel on which the light wave light may be incident from the light output region of the at least one optical fiber is formed or mounted in at least one of the plurality of walls.

The inner space of the housing may be isolated from outside by an end cap and is maintained in an air tight or vacuum state.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
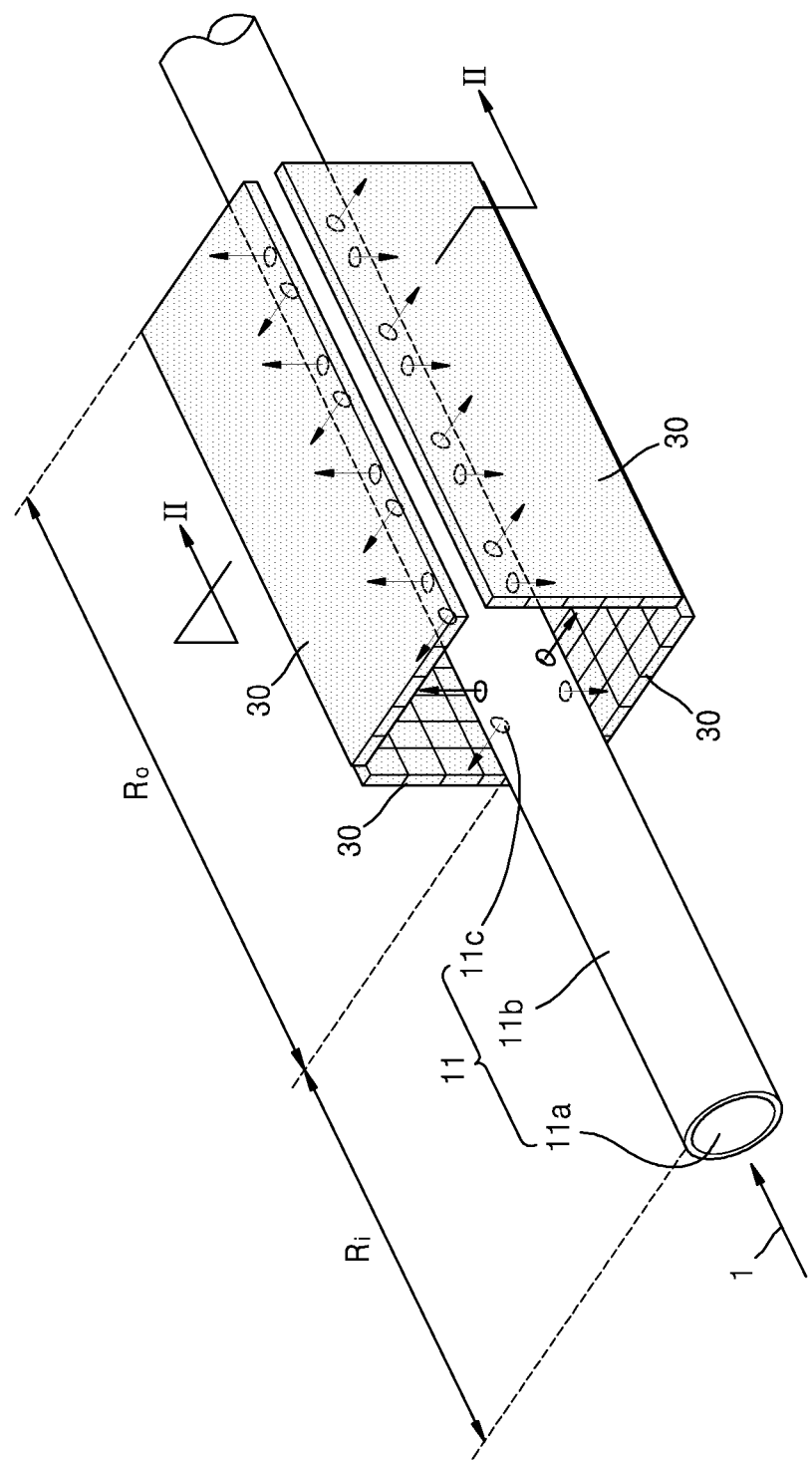
FIG. 1 is a perspective view showing a concept of a power generation system using an optical fiber and a plurality of solar panels surrounding the optical fiber, according to an example embodiment.

Embodiments of the present disclosure now will be described more fully hereinafter with reference to the accompanying drawings. The present disclosure may, however, be embodied in many different forms and should not be construed as limited to the example embodiments set forth herein. Rather, these embodiments are provided so that this disclosure will be thorough and complete, and will fully convey the scope of the disclosure to one of ordinary skill in the art. Like reference numerals refer to like elements throughout. Further, various elements and regions are schematically illustrated in the drawings. Thus, the present disclosure is not limited to relative sizes or relative distances illustrated in the accompanying drawings.

It will be understood that, although the terms first, second, etc. may be used herein to describe various elements, these elements should not be limited by these terms. These terms are only used to distinguish one element from another. For example, a first element could be termed a second element, and vice versa, without departing from the scope of the present disclosure.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising" used herein specify the presence of stated features, integers, steps, operations, members, components, and/or groups thereof, but do not preclude the presence or addition of one or more other features, integers, steps, operations, members, components, and/or groups thereof.

Unless otherwise defined, all terms including technical and scientific terms used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

When a certain embodiment may be implemented differently, a specific process order may be performed differently from the described order. For example, two consecutively described processes may be performed substantially at the same time or performed in an order opposite to the described order.

With respect to the accompanying drawings, variations from the shapes of the illustrations as a result, for example, of manufacturing techniques and/or tolerances, are to be expected. Thus, example embodiments should not be construed as limited to the particular shapes of regions illustrated herein but may be to include deviations in shapes that result, for example, from manufacturing. As used herein, the term "and/or" includes any and all combinations of one or more of the associated listed items. Also, the term "substrate" used in this specification may denote a substrate itself, or a stack including a substrate and a certain layer or film formed on a surface of the substrate. Also, in this specification, a "surface of a substrate" may denote an exposed surface of the substrate, or an outer surface of a certain layer or film formed on the substrate. Also, the term "above" or "on" may denote not only that an element is right on another element by contacting the other element, but also that an element is above the other element without contacting the other element.

A solar panel or a solar cell of a power generation part applied to the example embodiments described hereinafter is not limited to a particular structure. That is, a solar panel applied to one or more embodiments may be replaced by any types of photoelectric conversion devices or photoelectric conversion elements configured to generate electricity by using a light wave.

According to example embodiments, a power generation part may include a solid solar panel including a substrate having a rigid material or a flexible solar panel including a flexible substrate. According to another embodiment, a power generation part may include an organic polymer or inorganic semiconductor solar cell. According to another embodiment, a power generation part may include an amorphous or polycrystalline silicon-based solar panel. According to one or more embodiments, the power generation part may include an organic polymer or inorganic compound photoelectric conversion material formed on a substrate on a flexible metal or an inorganic film. One or more embodiments, the power generation part may include the Perovskite solar panel or a dye-sensitized solar panel. According to one or more embodiments, the power generation part may include a photoelectric conversion structure directly formed in an inner wall of the housing. Also, the solar panel or the solar cell described hereinafter is not limited to the particular structure described above.

Figure 2:
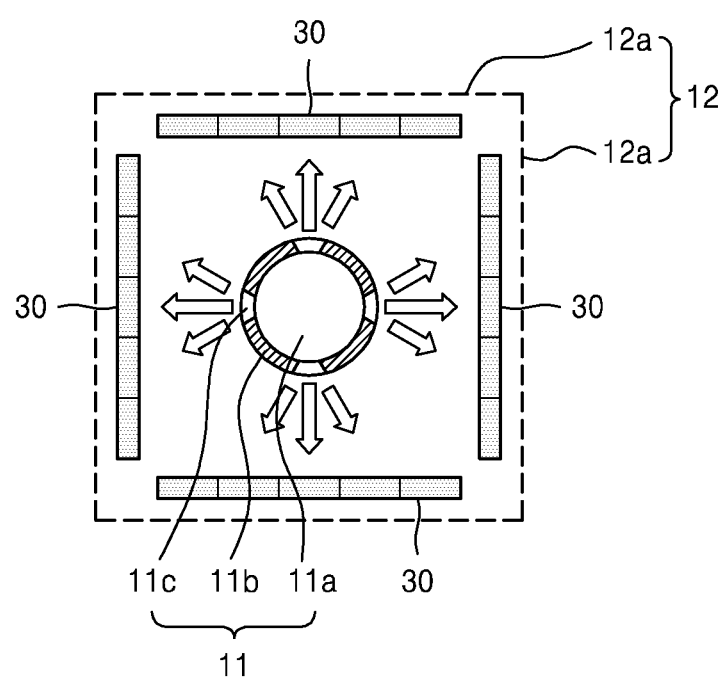
FIG. 2 is a cross-sectional view taken along a line I-I of FIG. 1 and shows a relationship between an optical fiber and a solar panel.

FIG. 1 is a perspective view showing a concept of a power generation system including an optical fiber 11 and a plurality of solar panels 30 surrounding the optical fiber 11, according to an example embodiment, and FIG. 2 is a cross-sectional view taken along a line I-I of FIG. 1 and shows a relationship between the optical fiber 11 and the plurality of solar panels 30.

Referring to FIGS. 1 and 2, a light output window 11c through which the light wave 1 passes is formed in a multiple number on an outer circumferential surface of a light output region Ro of the optical fiber 11, and a power generation part based on the plurality of solar panels 30 is arranged around the optical fiber 11. Here, a portion of the optical fiber 11, the portion being partially or generally surrounded by the plurality of solar panels 30, corresponds to a light output unit or the light output region Ro, and a portion of the optical fiber 11, through which the light wave 1 is injected, corresponds to a light guide unit or a light guide region Ri.

The light wave 1 may be injected into the light guide region Ri through a core 11a of the optical fiber 11 and a portion of the light wave 1 progressing through the core 11a in the light output region Ro may pass through the light output window 11c formed in a clad 11b covering the core 11a.

The light output window 11c of the light output region Ro may be formed by partially removing the clad 11b and the core 11a may be exposed through a bottom of the light output window 11c. According to the present embodiment, the light output window 11c of the optical fiber 11 is formed in four radial directions in correspondence to four solar panels 30 arranged in four directions.

The solar panels 30 are arranged on a passage of the light wave 1 from the light output window 11c of the optical fiber 11. The number of the solar panels 30 is not limited to a particular value, and according to other embodiments, two, three, four, or more solar panels 30 may be used, so that the light output region Ro of the optical fiber 11 may be partially or generally surrounded by the solar panels 30. Also, according to another example embodiment, the solar panels 30 may be mounted in a housing 12 having a shape of a square pillar or a polyprism having a plurality of walls 12a surrounding the optical fiber 11.

The optical fiber 11 may be mounted in the housing 12 or in an inner space of the housing 12, the inner space being provided by the plurality of solar panels 30, and may supply the light wave 1 to all of the plurality of solar panels 30.

Figure 3:
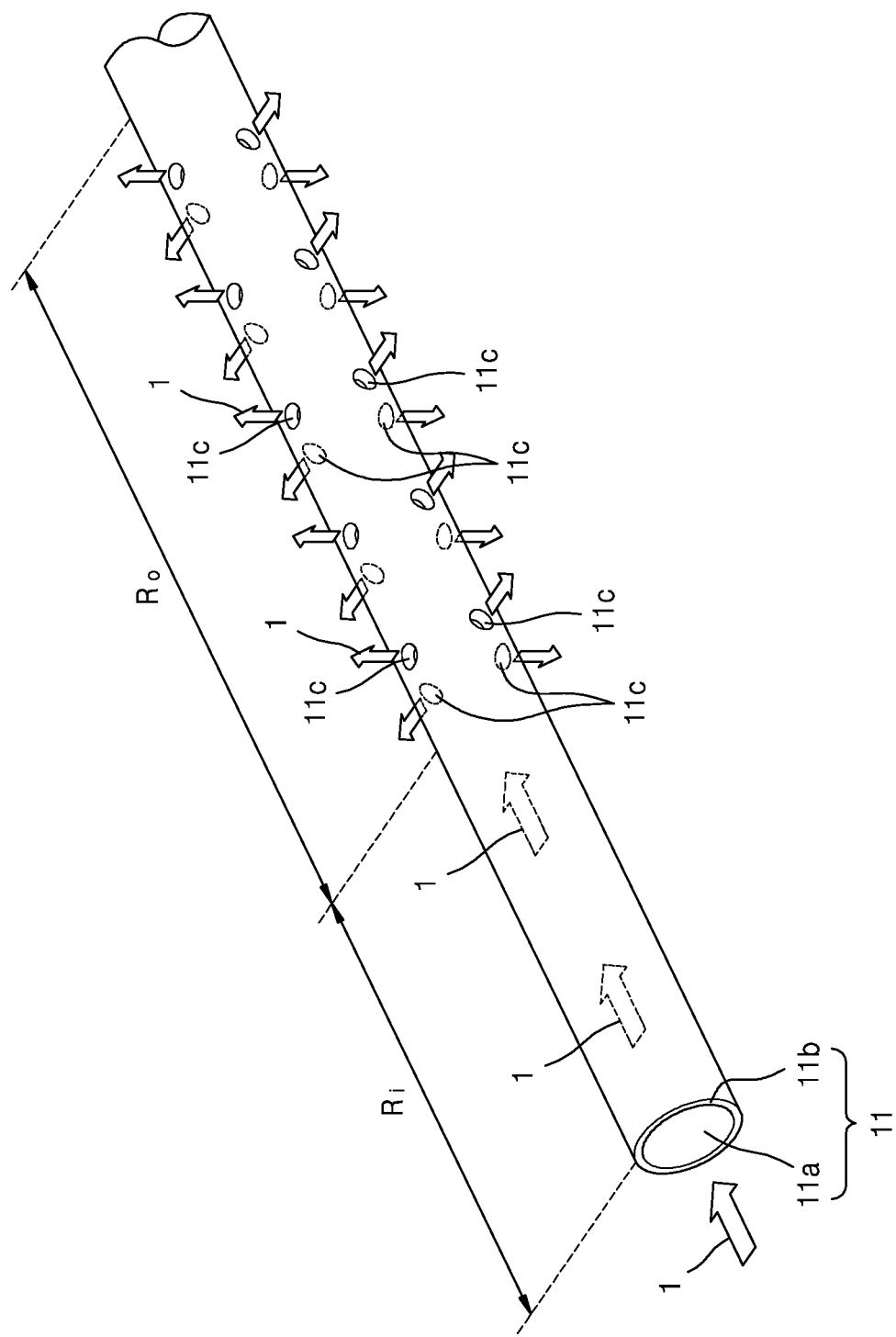
FIG. 3 is a perspective view for describing a light wave incident into a core of the optical fiber in a light guidance region and a light wave progressing (emitted) through a light output window in a light output region.
Figure 4:
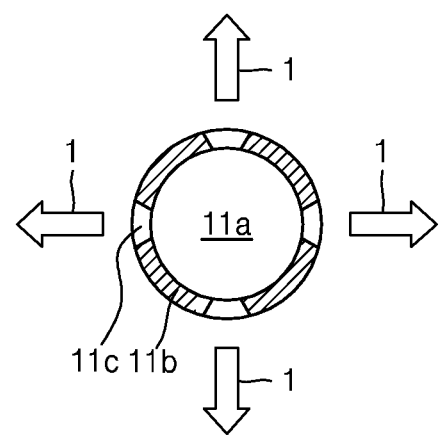
FIG. 4 is a longitudinal cross-sectional view of the optical fiber illustrated in FIG. 3.

FIG. 3 is a perspective view for describing the light wave 1 incident into the core 11a of the optical fiber 11 in the light guide region Ri and the light wave 1 progressing (emitted) through the light output window 11c of the light output region Ro. FIG. 4 is a longitudinal cross-sectional view of the optical fiber 11 and FIG. 5 is a lateral cross-sectional view of the optical fiber 11.

Figure 5:
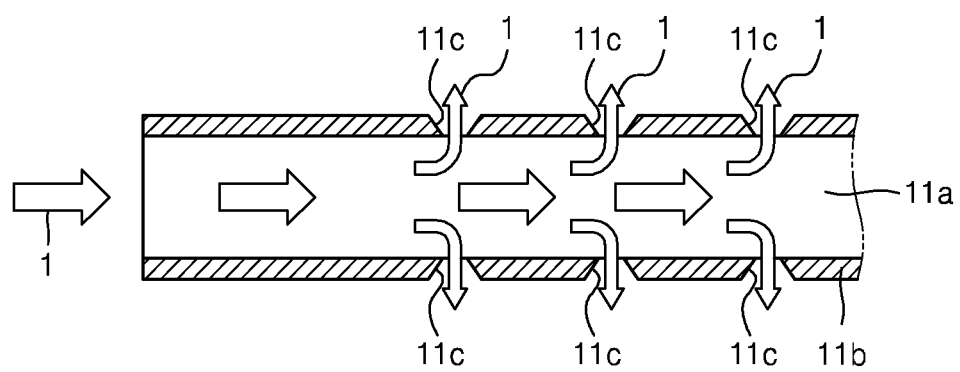
FIG. 5 is a lateral cross-sectional view of the optical fiber illustrated in FIG. 3.

Referring to FIGS. 3, 4, and 5, the core 11a through which the light wave 1 progresses is covered by the clad 11b. The clad 11b may keep the light wave 1 in the core 11a through interface reflection, thereby allowing the light wave 1 to progress in the core 11a. A surface of the core 11a may be exposed to a lower portion or a bottom of the light output window 11c formed in the clad 11b in the light output region Ro, and thus, a portion of the light wave 1 progressing through the core 11a may escape to the outside through this surface of the core 11a.

Figure 6:
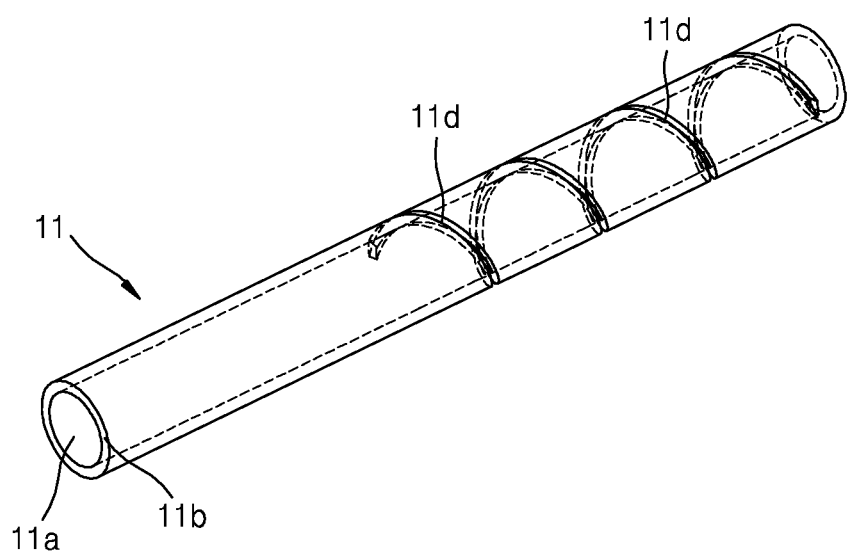
FIG. 6 illustrates an example of an optical fiber having a spiral light output unit formed in a clad, according to an embodiment.

FIG. 6 illustrates an example of the optical fiber 11 having a spiral-shaped light output unit 11d formed in the clad 11b. The spiral-shaped light output unit 11d may be formed by grooves formed as a spiral shape surrounding an outer circumferential surface of the optical fiber 11. The grooves may be continuously formed throughout the outer circumferential surface of the optical fiber 11 or may be partially broken and discontinuously formed in the clad 11b. However, various embodiments are not technically limited to a specific light output window having a certain structure or shape formed in the clad 11b.

Figure 7:
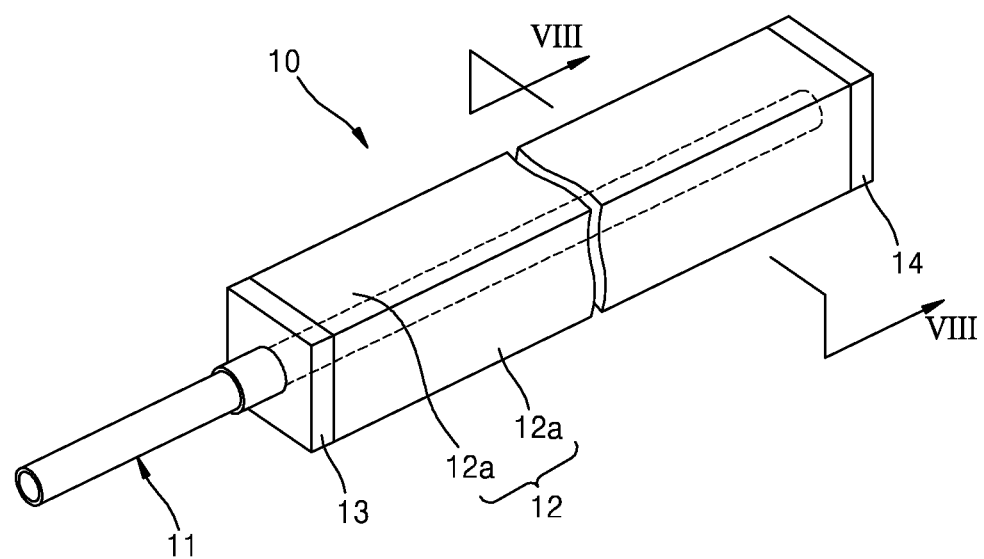
FIG. 7 schematically illustrates a solar power generation unit having a shape of a square bar, according to a detailed embodiment.

FIG. 7 is a schematic view of a solar power generation unit 10 having a shape of a square bar according to a detailed embodiment.

The solar power generation unit 10 illustrated in FIG. 7 may include the housing 12 having the plurality of walls 12a forming an inner space, in which the light output region Ro of the optical fiber 11 is included. As described above with reference to FIGS. 1 and 2, in the housing 12, the one or more solar panels 30 partially or generally surrounding the light output region Ro of the optical fiber 11 are arranged.

Sealing members or end caps 13 and 14 are coupled to both ends of the housing 12 and the optical fiber 11 penetrates one end cap 13. The inner space of the housing 12 formed by the end caps 13 and 14 may be isolated from the outside and may maintain a vacuum state. The inner space of the housing 12 having the vacuum state may prevent light scattering or light absorption due to moisture, impurity materials, etc., thereby increasing efficiency of the use of light for power generation.

Figure 8:
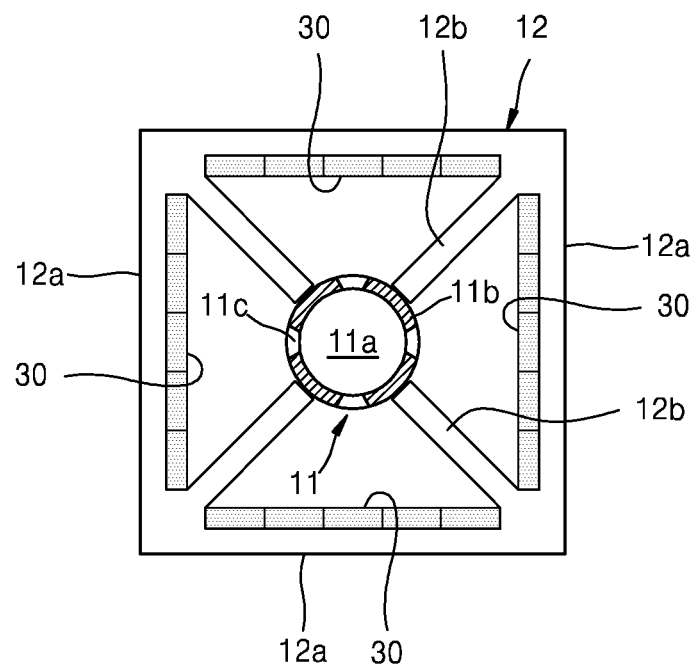
FIG. 8 is a cross-sectional view taken along a line II-II of FIG. 7.
Figure 9:
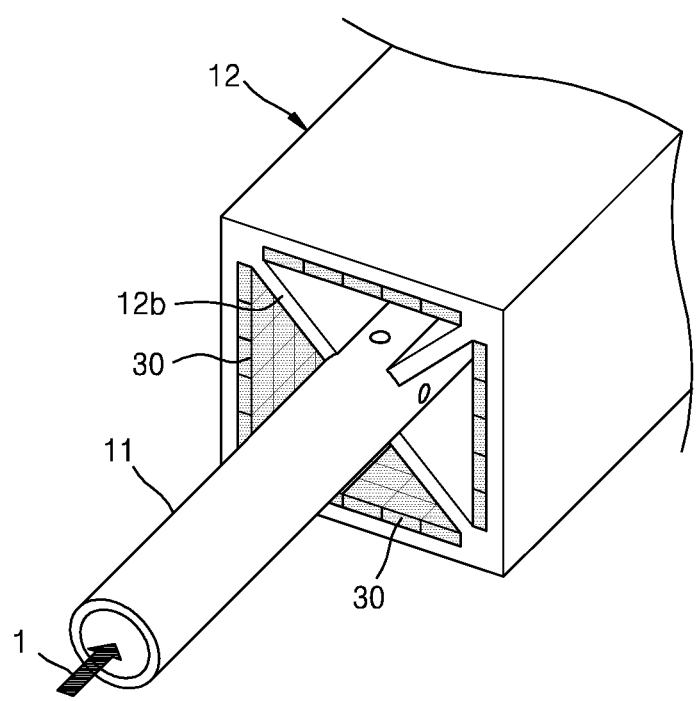
FIG. 9 three-dimensionally shows the cross-sectional view of FIG. 8.

FIG. 8 is a cross-sectional view taken along a line II-II of FIG. 7 and FIG. 9 three-dimensionally illustrates the cross-sectional view of FIG. 8.

As illustrated in FIGS. 7, 8, and 9, the housing 12 has a square bar shape having a square cross-section and the light output region Ro of the optical fiber 11 is located in the middle of the housing 12. Also, a rib 12b extending by a certain length in a diagonal direction from four corners of the housing 12 toward a center thereof supports the optical fiber 11 provided in the middle of the housing 12. Also, the solar panel 30 is mounted on each of inner surfaces of the four walls 12a in the housing 12.

The solar panel 30 is not limited to a specific material or structure, and may be mounted on an inner wall of the housing 12 as a member having a complete form arranged on an additional substrate. According to other embodiments, the solar panel 30 may be formed on the inner wall of the housing 12 by coating a photoelectric conversion material layer and electrodes at both sides of the photoelectric conversion material layer.

Figure 10:
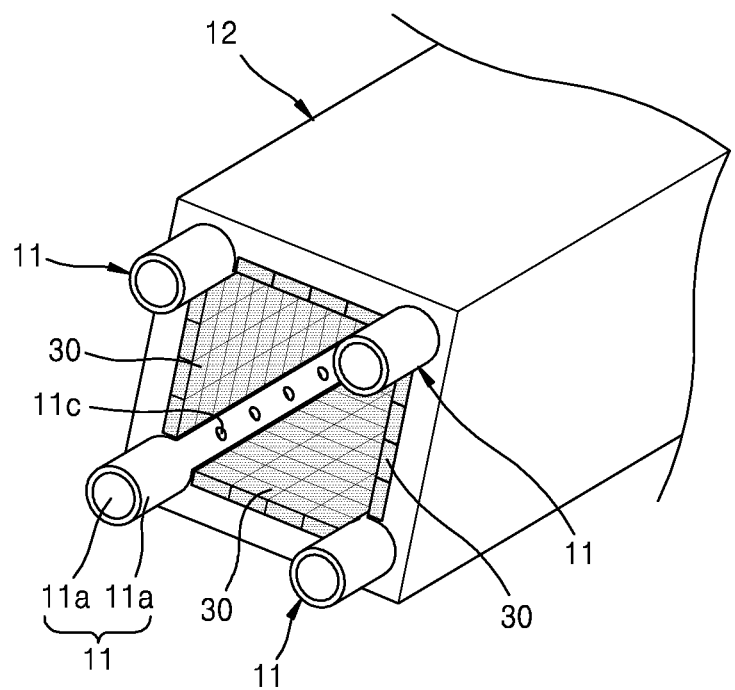
FIG. 10 shows a partial structure of a solar power generation unit including a housing in which a plurality of optical fibers are mounted, according to another embodiment.
Figure 11:
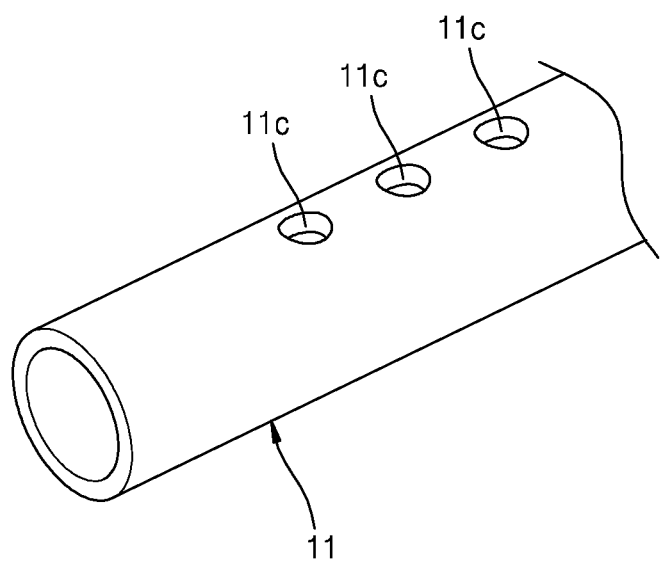
FIG. 11 illustrates an example of an optical fiber which may be applied to the solar power generation unit illustrated in FIG. 10.
Figure 12:
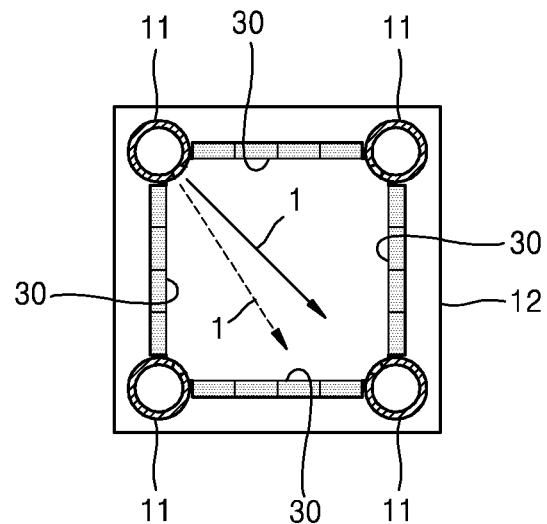
FIG. 12 illustrates an example of a light output direction in an inner space of a housing from an optical fiber.

FIG. 10 shows a partial structure of a solar power generation unit including the housing 12 in which a plurality of optical fibers 11 are mounted, according to another embodiment. FIG. 11 illustrates an example of the optical fiber 11, which may be applied to the solar power generation unit illustrated in FIG. 10 and FIG. 12 illustrates an example of a light output direction from the optical fibers 11 in the housing 12.

Referring to FIG. 10, the solar panels 30 are mounted or formed in the inner wall of the housing 12 having a square hollow rod shape. Also, the optical fibers 11 are mounted at four corners in the housing 12. In this structure, the optical fibers 11 including the light output window 11c from which the light wave 1 is emitted in only one direction as illustrated in FIG. 11 may be implemented. Here, as illustrated in FIG. 12, the optical fibers 11 have a light output direction (indicated by arrows) toward the inner space of the housing 12, wherein the light output direction may be aligned toward a center (the arrow of a solid line) of the inner space of the housing 12 or to face (the arrow of a dotted line) any one of two solar panels at an opposite side beyond the center of the inner space of the housing 12.

Figure 13:
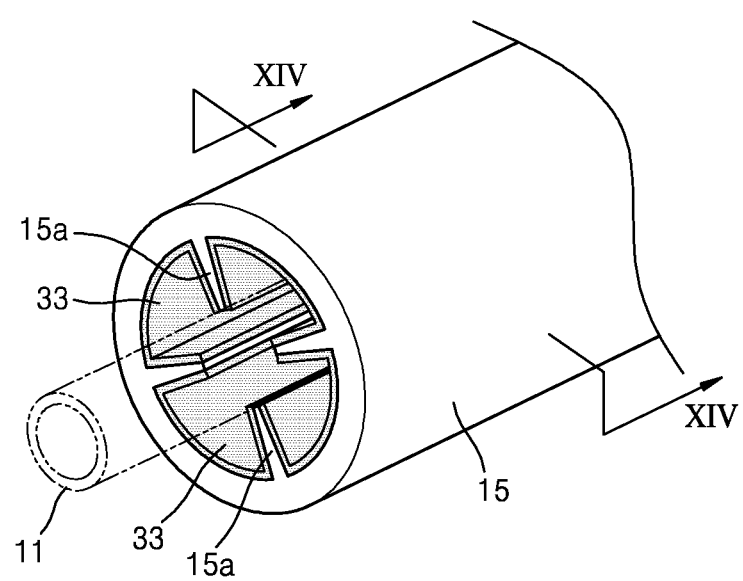
FIG. 13 three-dimensionally shows a schematic internal structure of a housing of a solar power generation unit according to another embodiment.
Figure 14:
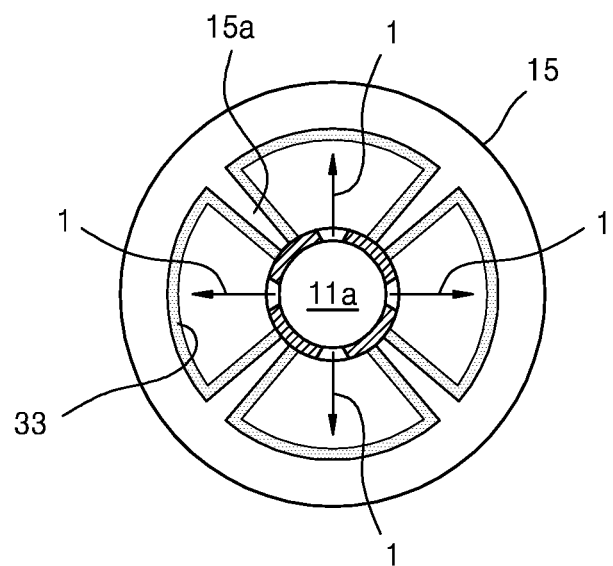
FIG. 14 is a cross-sectional view taken along a line III-III of FIG. 13.

FIG. 13 three-dimensionally illustrates a schematic internal structure of a housing 15 of a solar power generation unit, according to another embodiment, and FIG. 14 is a cross-sectional view taken along a line III-III of FIG. 13.

Referring to FIGS. 13 and 14, the housing 15 may have a circular or oval pipe shape, or a tube shape. The optical fiber 11 is located in the middle of the housing 15 by being supported by a plurality of ribs 15a extending in a direction from an inner wall of the housing 15 toward the center of the housing 15. A solar panel 33 is coupled to or formed on an inner surface of the housing 15. The solar panel 33 may be directly formed on an inner wall of the housing 15 as a stack including a photoelectric conversion material and an electrode. According to another embodiment, the solar panel 33 may be replaced by a flexible solar panel based on a flexible film. According to these embodiments, a difference between progression distances of a light wave from the optical fiber 11 to respective portions of the solar panel 33 is less than that of the case of the solar power generation unit including the square-shaped housing according to the embodiment described above.

Figure 15:
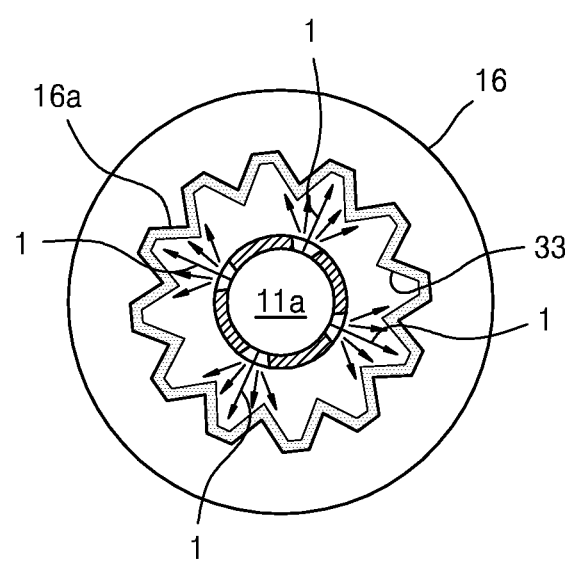
FIG. 15 schematically illustrates an example of a structure of a housing of a solar power generation unit according to another embodiment.

FIG. 15 schematically illustrates an example of a structure of a housing 16 of a solar power generation unit according to another embodiment. The housing 16 according to the present embodiment has a hollow cylindrical shape and an inner wall 16a wrinkled as a wave shape is formed in the housing 16. Accordingly, with respect to a cross-section of the housing 16, an inner space of the housing 16 has a wrinkled wave shape or a star shape. According to this structure, the inner wall 16a having the wave shape may have a largely increased area.

A photoelectric conversion structure for solar power generation may be stacked in the wrinkled inner wall 16a and one or more optical fibers having various shapes described above may be mounted in the inner wall 16a.

Also, a protrusion unit of the wrinkled inner wall 16a may support the optical fibers located in the center of the inner space of the housing 16.

Figure 16:
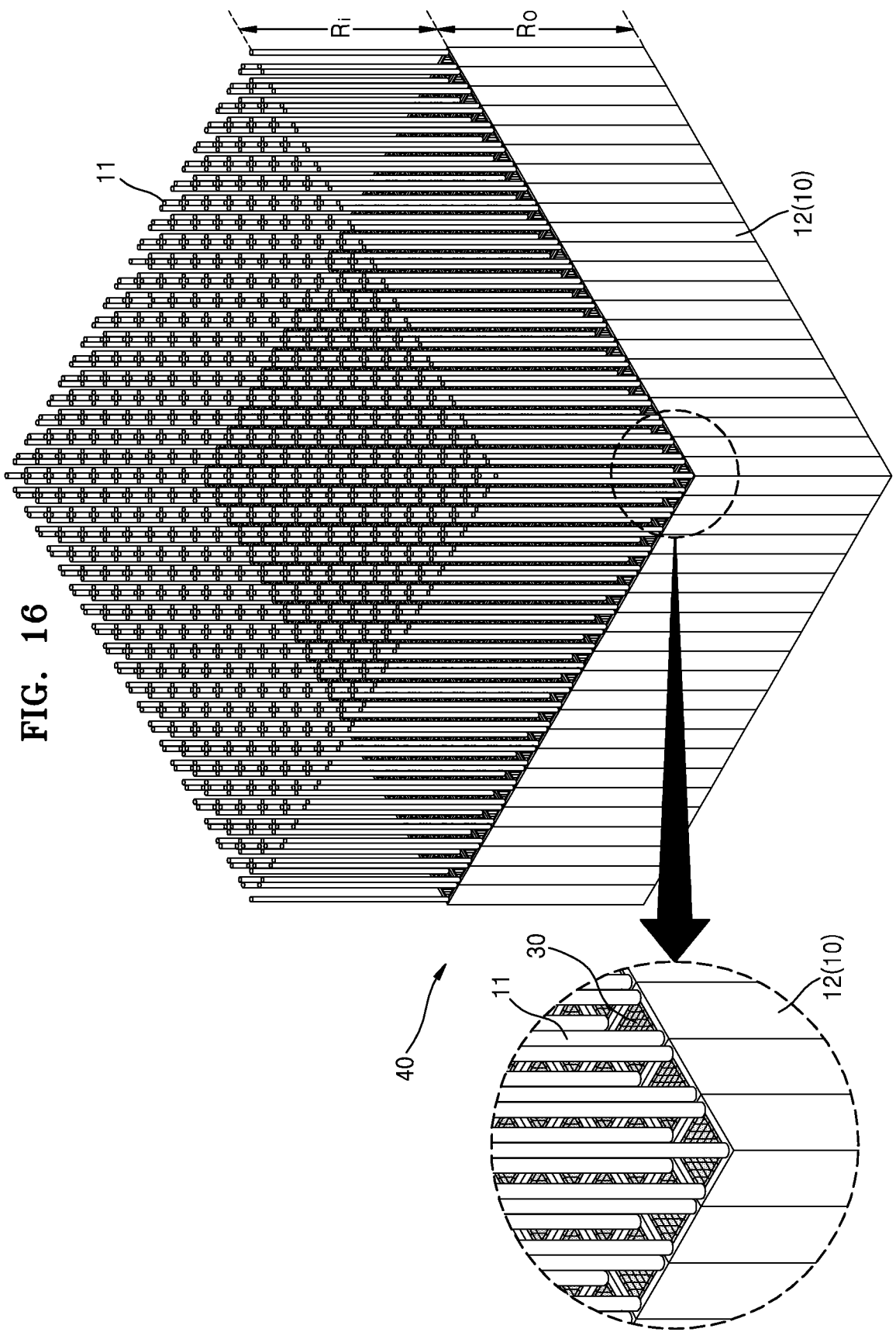
FIG. 16 schematically illustrates a solar power generation structure of a solar power generation system including a plurality of solar power generation units.
Figure 17:
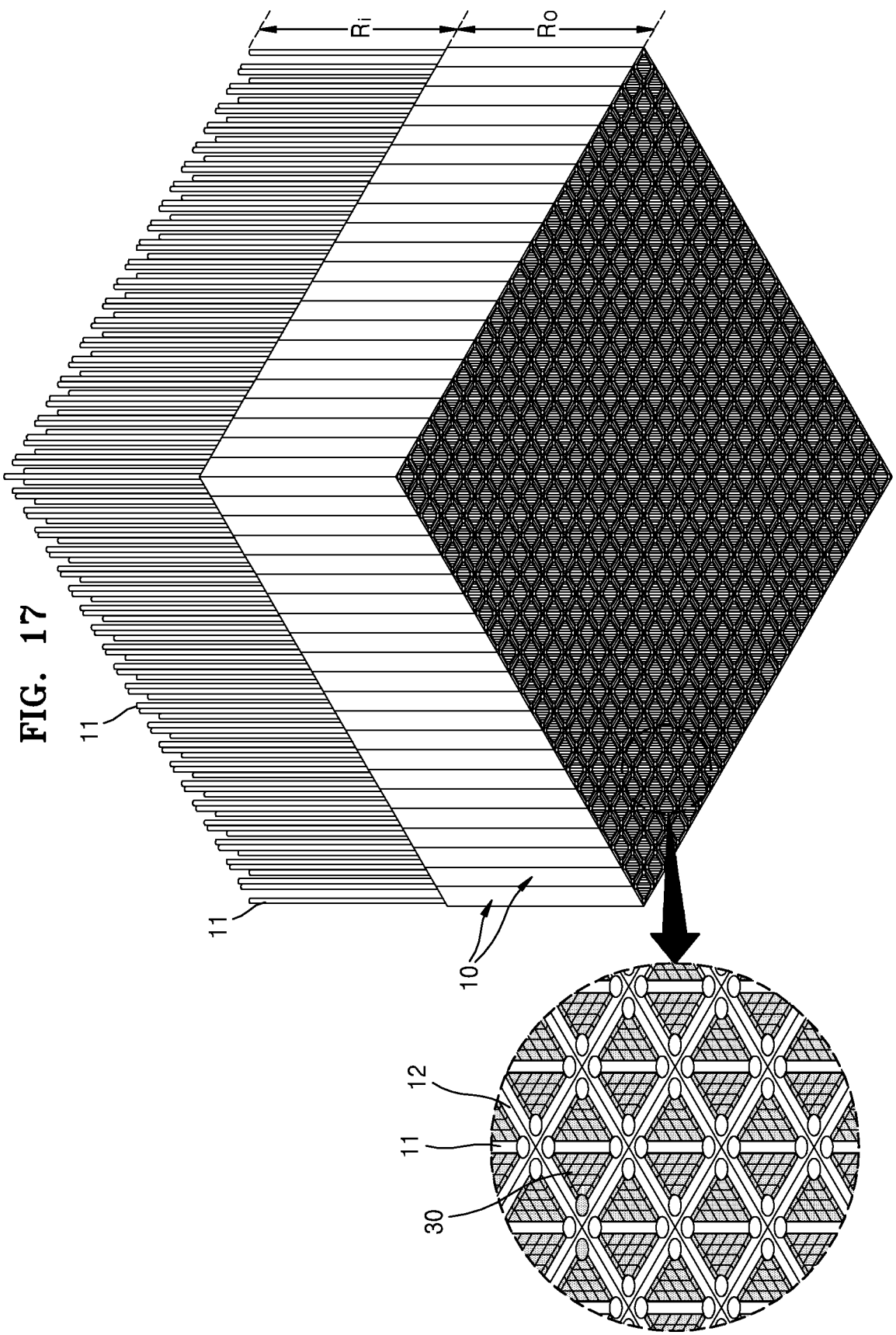
FIG. 17 partially illustrates a bottom portion of the solar power generation structure illustrated in FIG. 16.

FIG. 16 schematically illustrates a solar power generation structure of a power generation system including a plurality of solar power generation units 10 and FIG. 17 partially illustrates a lower portion of the solar power generation structure illustrated in FIG. 16.

Referring to FIGS. 16 and 17, the plurality of solar power generation units 10 arranged in a direction (a vertical direction in the drawings) are densely arranged on a plane two-dimensionally. The solar power generation units 10 include the housing 12 having a shape of a square tube, and the plurality of optical fibers 11 having a light output region Ro in the housing 12. The solar power generation units 10 are densely arranged in two directions, thereby realizing a large-sized solar power generation structure 40.

The light guide regions Ri of the plurality of optical fibers 11 provided at an upper portion of the solar power generation structure 40 illustrated in FIG. 16 may be grouped (bundled) into one or more groups and each bundle allows the sunlight to converge by using an optical system.

Figure 18:
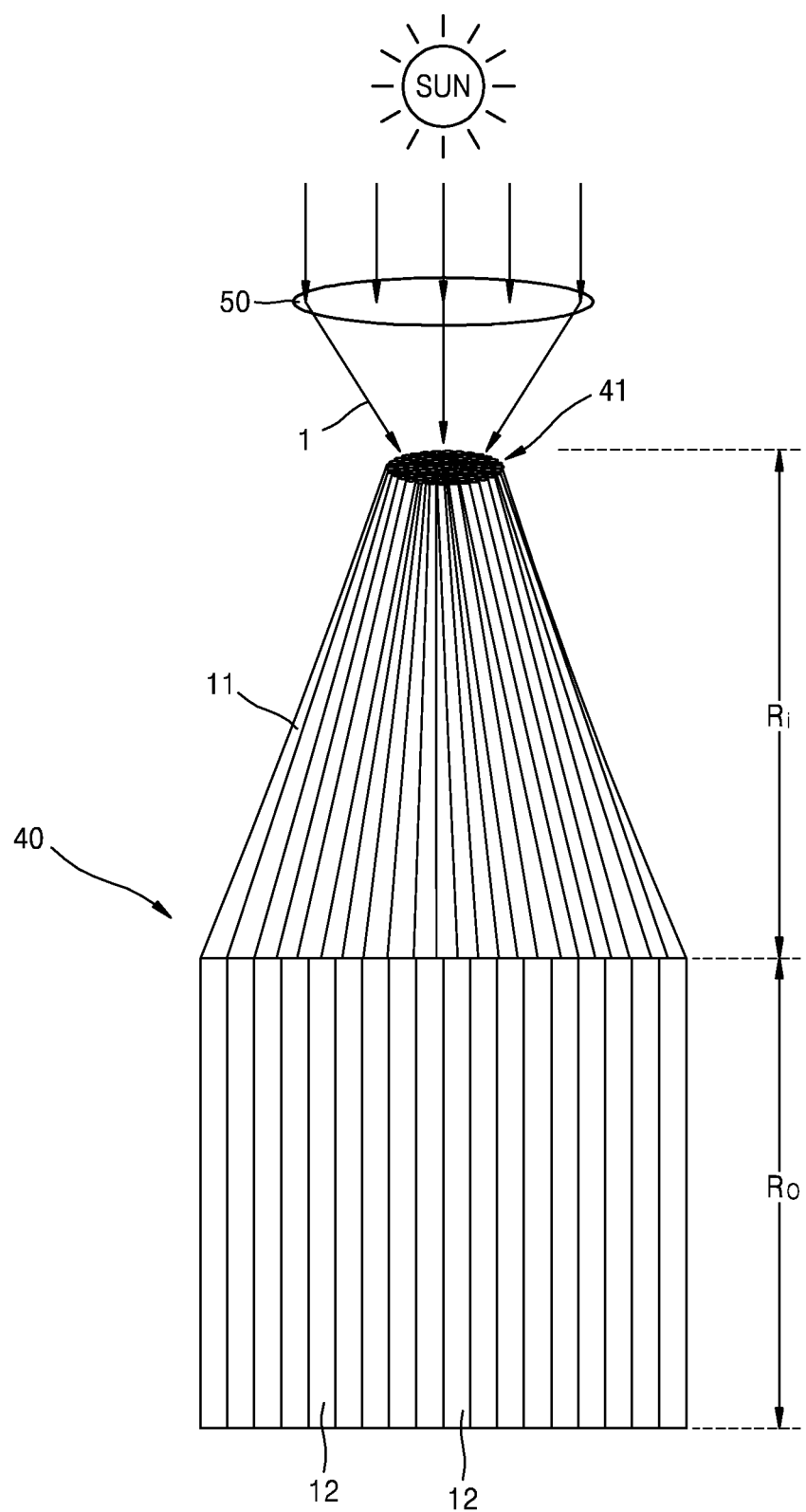
FIG. 18 illustrates an example of a schematic structure of a solar power generation system according to an example embodiment.

FIG. 18 is a schematic structural view of a power generation system to which the solar power generation structure 40 illustrated in FIGS. 16 and 17 is applied.

As illustrated in FIG. 18, the external optical fibers of the solar power generation structure 40 illustrated in FIG. 16, that is, front ends of the light guide regions Ri of the optical fibers 11 are tied into one to form one common light incident surface or a light incident unit 41 based on integration of cross-sections of the plurality of optical fibers 11, and here, an optical system 50 configured to allow the sunlight to converge in the light incident unit 41 may be mounted.

According to the present example embodiment, the solar panel of the solar power generation unit may include the well-known Perovskite solar panel or cell. The Perovskite solar panel or cell may include a structure compound.

As described above, according to the one or more of the above embodiments, the solar power generation unit having the shape of the circular pillar or the square pillar and the solar power generation system are provided. The solar power generation unit has a structure in which the solar panel is arranged around a space in which one or more optical fibers are located. The solar power generation unit of this bar shape in a multiple number may be three-dimensionally integrated, so as to enable high capacity power generation in a small space, and a main body of the solar power generation system except a light incident surface may be mounted indoor. According to this solar power generation unit, while mobility, costs, and mounting areas are significantly reduced, a large capacity solar power plant and small and medium-sized power generation systems may be publicly distributed. In particular, environmental destruction caused to obtain an area to mount the solar power plant according to the related art, the area being not relatively less, and an increase in management costs due to the life span reduction based on a change in peripheral environment may be innovatively improved. Furthermore, application fields may be widened to include household solar power electricity, solar power generation in a region in which it is difficult to obtain a land, space engineering, large vessels, electrical automobiles, portable electronic products, etc.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the disclosure as defined by the following claims.

What is claimed is:

1. A solar power generation unit comprising:
   at least one optical fiber comprising a light output region comprising a light output window and a light guide region guiding a light wave to the light output region;
   a housing of a tube type, the housing having an inner space in which the at least one optical fiber is located;
   wherein the housing has a plurality of walls forming the inner space, the at least one optical fiber is located in a middle region of the inner space of the housing, and the solar panel is formed or mounted in at least one of the plurality of walls, wherein the light output window comprises continuous grooves formed in a spiral shape in an outer circumferential surface of the at least one optical fiber; and
   a power generation part comprising at least one solar panel provided at least at a side of the inner space of the housing and configured to generate power in response to the light wave incident thereon from the light output region of the at least one optical fiber.

2. The solar power generation unit of claim 1, wherein the housing has a cross-section with a square shape, a polygon shape, a circle shape, or an oval shape.

3. The solar power generation unit of claim 1, further comprising one or more ribs supporting the at least one optical fiber located in the inner space that are formed to protrude from the plurality of walls of the housing.

4. The solar power generation unit of claim 2, wherein the inner space of the housing of the tube type has an inner wall with a corrugated shape, and
   the solar panel is formed in the inner wall.

5. The solar power generation unit of claim 2, wherein a rib supporting the at least one optical fiber is formed in an inner wall of the housing, and
   the solar panel is formed in the inner wall and the rib of the housing.

6. The solar power generation unit of claim 2, wherein the housing has an inner wall with a corrugated shape, and
   the solar panel is formed in the inner wall and the at least one optical fiber is apart from the inner wall.

7. The solar power generation unit of claim 1, wherein the inner space of the housing is isolated from outside by an end cap and is maintained in an air tight or vacuum state.

8. A solar power generation system comprising:
   a plurality of solar power generation units; and
   an optical structure for supplying sunlight to at least one of the plurality of solar power generation units,
   wherein
   at least one of the solar power generation units comprises:
   at least one optical fiber comprising a light output region comprising at least one light output window and a light guide region guiding a light wave to the light output region;
   a housing of a tube type, the housing having an inner space in which the at least one optical fiber is located;
   wherein the housing has a plurality of walls forming the inner space, the at least one optical fiber is located in a middle region of the inner space of the housing, and the solar panel is formed or mounted in at least one of the plurality of walls, wherein the light output window comprises continuous grooves formed in a spiral shape in an outer circumferential surface of the at least one optical fiber; and
   a power generation part comprising at least one solar panel provided at least at a side of the inner space of the housing and configured to generate power in response to the light wave incident thereon from the light output region of the at least one optical fiber, and
   the optical structure is configured to converge sunlight to the light guide region of the at least one optical fiber and supply the light wave to the solar power generation unit.

9. The solar power generation system of claim 8, wherein the light guide region of the optical fibers of the plurality of the power generation unit are grouped into one or more groups, and facets of the optical fibers of the one or more groups form a light wave incident surface.

10. The solar power generation system of claim 9, further comprising one or more ribs supporting the at least one optical fiber located in the inner space that are formed to protrude from the plurality of walls of the housing.

11. The solar power generation system of claim 8, wherein the inner space of the housing is isolated from outside by an end cap and is maintained in an air tight or vacuum state.

* * * * *